United States Patent
Jee et al.

(10) Patent No.: US 8,610,195 B2
(45) Date of Patent: Dec. 17, 2013

(54) NON-VOLATILE MEMORY DEVICES AND METHODS OF MANUFACTURING THE SAME

(75) Inventors: Jung-Geun Jee, Seoul (KR); Seok-Hoon Kim, Hwaseong-si (KR); Su-Jin Shin, Hwaseong-si (KR); Woo-Sung Lee, Yongin-si (KR); Tae-Ouk Kwon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 309 days.

(21) Appl. No.: 13/092,239

(22) Filed: Apr. 22, 2011

(65) Prior Publication Data

US 2011/0291175 A1 Dec. 1, 2011

(30) Foreign Application Priority Data

May 25, 2010 (KR) .......................... 10-2010-0048511

(51) Int. Cl.
*H01L 29/788* (2006.01)
(52) U.S. Cl.
USPC .. 257/315; 257/316; 257/E29.3; 257/E29.304
(58) Field of Classification Search
USPC .......................... 257/315, 316, E29.3, E29.304
See application file for complete search history.

(56) References Cited

U.S. PATENT DOCUMENTS

| | | | | |
|---|---|---|---|---|
| 6,914,013 B2 * | 7/2005 | Chung | | 438/770 |
| 6,984,559 B2 * | 1/2006 | Wang et al. | | 438/257 |

FOREIGN PATENT DOCUMENTS

| | | | |
|---|---|---|---|
| KR | 1020050118823 A | 12/2005 |
| KR | 100552588 B1 | 2/2006 |
| KR | 1020060122139 A | 11/2006 |
| KR | 1020080060456 A | 7/2008 |

* cited by examiner

*Primary Examiner* — Minh-Loan T Tran
(74) *Attorney, Agent, or Firm* — Myers Bigel Sibley & Sajovec, P.A.

(57) ABSTRACT

A non-volatile memory device includes a field region that defines an active region in a semiconductor substrate, a floating gate pattern on the active region, a dielectric layer on the floating gate pattern and a control gate on the dielectric layer. The control gate includes a first conductive pattern that has a first composition that crystallizes in a first temperature range, and a second conductive pattern that has a second composition that is different from the first composition and that crystallizes in a second temperature range that is lower than the first temperature range, the first conductive pattern being between the dielectric layer and the second conductive pattern.

20 Claims, 6 Drawing Sheets

NON-VOLATILE MEMORY DEVICES AND METHODS OF MANUFACTURING THE SAME

CROSS-REFERENCE TO RELATED APPLICATIONS

This application claims the benefit of Korean Patent Application No. 10-2010-0048511 filed on May 25, 2010, in the Korean Intellectual Property Office, the disclosure of which is incorporated herein in its entirety by reference.

BACKGROUND

Example embodiments relate to non-volatile memory devices and to methods of manufacturing the same, and more particularly, to flash memory devices and methods of manufacturing flash memory devices.

Semiconductor memory devices may generally be classified as either volatile or non-volatile memory devices. Volatile memory devices (e.g., dynamic random access memory devices and static random access memory devices) may have relatively higher input/output (I/O) speeds, but lose data stored therein when power to the device is shut off. Non-volatile memory devices (e.g., read-only memory devices and electrically erasable programmable read-only memory devices) maintain data stored therein even when power is shut off. Flash memory devices are an advanced type of electrically erasable programmable read-only memory which can erase data at relatively high speeds.

In a flash memory device, a plurality of stacked gate structures are arranged in a cell region of a semiconductor substrate. The semiconductor substrate may comprise a bulk semiconductor substrate or a semiconductor layer that is formed on a semiconductor or non-semiconductor substrate. Each stacked gate structure includes a tunnel oxide pattern (e.g., a gate oxide pattern), a floating gate pattern and a control gate pattern. The floating gate pattern and the control gate pattern are separated by a dielectric layer.

In response to electric voltages that are applied to the substrate and the floating gate pattern, electrons may be either pushed into or pulled out of the floating gate pattern via a Fowler-Nordheim (F-N) tunneling mechanism and/or a channel hot electron injection mechanism in order to store or erase data. The voltage may be applied to the floating gate pattern through the dielectric layer.

A tunnel oxide layer is formed in the cell region of the substrate. The floating gate pattern, the dielectric layer and the control gate pattern are then stacked on the tunnel oxide layer, thereby forming the stacked gate structure in the cell region of the substrate.

A high coupling ratio is required between the floating gate pattern and the control gate pattern in order to induce the voltage applied to the control gate pattern to the floating gate pattern. The coupling ratio is a function of both the surface area and the thickness of the dielectric layer, with larger surface areas and smaller thicknesses both acting to increase the coupling ratio. However, if the thickness of the dielectric layer is reduced too much, the electrons in the dielectric layer may tend to leak into the floating gate pattern, thereby deteriorating the charge retention characteristics of the floating gate pattern. Consequently, the surface of the dielectric layer tends to be enlarged as necessary to increase the coupling ratio.

Since the floating gate pattern typically is formed using doped polysilicon, it may be difficult to form the dielectric layer as a thin thermal oxide layer on the floating gate pattern. In addition, there is a problem that the thin thermal oxide layer may exhibit excessive leakage currents. Consequently, a multilayer structure that includes a sequentially stacked first oxide layer, followed by a nitride layer, followed by a second oxide layer is usually used as the dielectric layer in a flash memory device. Such an oxide/nitride/oxide dielectric layer (hereinafter, referred to as ONO layer) has a dielectric constant that is larger than the dielectric constant of a thermal oxide layer.

In a conventional flash memory device, the floating gate pattern comprises a plurality of floating gates that are formed on line-shaped active regions. A device isolation layer is formed on a field region portion of the substrate, and this field region (and/or the device isolation layer thereon) may define the active region portion of the substrate. An upper surface of the device isolation layer may be lower than an upper surface of the floating gate pattern. Thus, a field recess is provided between neighboring floating gates and side surfaces of the floating gates are exposed to the field recess. The dielectric layer is formed on the device isolation layer and the floating gate pattern along a surface profile of the substrate including the field recess. Thus, the side surfaces and a top surface of the floating gate pattern are covered with the dielectric layer. Therefore, the width of the field recess is reduced by the thickness of the dielectric layer on the sidewalls of the adjacent floating gate lines. A polysilicon layer is formed on the dielectric layer to fill the field recess, to thereby form the control gate pattern of the flash memory device.

Unfortunately, the reduction in the width of the field recess that results from forming the dielectric layer on the side surfaces of the floating gates may cause non-uniform deposition of the polysilicon layer, and thus various process defects such as voids and/or seams may be formed in the control gate pattern. Moreover, as the integration density of flash memory devices is increased, the gap distance between the floating gates is reduced, and hence an aspect ratio of the field recess tends to be increased. With such higher aspect ratios, the likelihood that voids and/or seams may be generated is increased.

The presence of voids and/or seams in the control gate pattern may reduce the coupling ratio of the flash memory device, which may deteriorate the electric characteristics of the flash memory device. Particularly, when a heat treatment is conducted on the polysilicon layer for purposes of reducing the specific resistance of the control gate pattern, the silicon bonds (Si—Si bond) are frequently broken, and silicon (Si) atoms may migrate to the boundary surface between the dielectric layer and the control gate pattern. Thus, a depletion field is intensively found between the dielectric layer and the control gate pattern due to the heat treatment.

SUMMARY

Example embodiments of the present inventive concept provide non-volatile memory devices having control gate patterns that have reduced numbers of voids and seams despite the high aspect ratio of the field recesses of the devices. Other example embodiments of the present inventive concept provide methods of manufacturing such non-volatile memory devices.

According to some example embodiments, non-volatile memory devices are provided that have a field region that defines an active region in a semiconductor substrate, a floating gate pattern on the active region, a dielectric layer on the floating gate pattern, and a control gate on the dielectric layer. The control gate includes a first conductive pattern that has a first composition that crystallizes in a first temperature range, and a second conductive pattern that has a second composition that is different from the first composition and that crystallizes in a second temperature range that is lower than the first temperature range. The second temperature range may be, for example, between about 500° C. and about 700° C., and the first temperature range may be, for example, between about 750° C. and about 850° C. The first conductive pattern being between the dielectric layer and the second conductive pattern.

In some embodiments, the floating gate pattern comprises a first floating gate pattern, and the non-volatile memory device further includes a second floating gate pattern that is spaced apart from the first floating gate pattern to define a recess therebetween. A distance between the first and second floating gate patterns that defines the width of the recess may be between about 20 nm and about 25 nm, and an aspect ratio of the recess may be between about 1 to about 3. The first floating gate pattern may protrude from a surface of the device isolation pattern to a height of about 60 nm to about 75 nm.

In some embodiments, the first conductive pattern may be an undoped polysilicon pattern, and the second conductive pattern may be a polysilicon pattern doped with impurities such as, for example, carbon (C), nitrogen (N), oxygen (O), phosphorus (P), and/or boron (B), and/or compounds thereof. The control gate may also include a third conductive pattern on the second conductive pattern, the third conductive pattern including at least a metal, a metal nitride and/or a metal silicide. In some cases, a thickness of the first conductive pattern may be about 12 nm or less.

In some embodiments, the first conductive pattern may be conformally coated on the dielectric layer, and a density of the first conductive pattern may exceed a density of second conductive pattern.

Pursuant to further example embodiments, non-volatile memory devices are provided that include a semiconductor substrate that has a first active region that extends in a first direction, a second active region that extends in the first direction substantially parallel to the first active region, and a field region having a device isolation pattern thereon between the first and second active regions. These devices further include a first gate pattern that extends in the first direction on the first active region and a second gate pattern that extends in the first direction on the second active region, the first and second gate patterns defining a recess therebetween, where an upper surface of the device isolation pattern forms a bottom surface of the recess. A dielectric pattern covers an upper surface of the first gate pattern, an upper surface of the second gate pattern and a first side surface, a second side surface and the bottom surface of the recess along a surface profile of the recess and the first and second gate patterns. The dielectric pattern extends in a second direction that is substantially perpendicular to the first direction. The device further includes a control gate pattern on the dielectric pattern that has a first conductive pattern on the dielectric pattern along the surface profile of the recess and the first and second gate patterns, and a second conductive pattern on the first conductive pattern. These first and second conductive patterns fill the recess.

In some embodiments, the first conductive pattern may include undoped polysilicon and the second conductive pattern may include polysilicon that doped is with impurities such as carbon (C), nitrogen (N), oxygen (O), phosphorus (P), boron (B) and compounds thereof. An aspect ratio of the recess may be in a range of about 1 to about 3, and the width of the recess may be in a range of about 20 nm to about 25 nm.

The dielectric pattern may be a multilayer of a first oxide layer, a nitride layer and a second oxide layer that are sequentially stacked.

Pursuant to further example embodiments, non-volatile memory devices are provided that include a semiconductor substrate that includes a first active region that extends in a first direction, a second active region that extends in the first direction substantially parallel to the first active region, and a field region having a device isolation pattern thereon between the first and second active regions. The devices also include a first floating gate pattern that extends in the first direction on the first active region and a second floating gate pattern that extends in the first direction on the second active region, the first and second floating gate patterns defining a recess therebetween, where an upper surface of the device isolation pattern forms a bottom surface of the recess. A dielectric pattern covers an upper surface of the first floating gate pattern, an upper surface of the second floating gate pattern and a first side surface, a second side surface and the bottom surface of the recess along a surface profile of the recess and the first and second floating gate patterns. A control gate pattern is on the dielectric pattern, the control gate pattern including a first conductive pattern that has a first composition that crystallizes in a first temperature range and a second conductive pattern that has a second composition that is different from the first composition and that crystallizes in a second temperature range that is lower than the first temperature range.

Other example embodiments provide a non-volatile memory device including a semiconductor substrate divided into a field region having a device isolation pattern and an active region defined by the device isolation pattern, a first dielectric pattern on the active region of the substrate in a first direction, a first gate pattern arranged on the first dielectric pattern and having a gap distance in a second direction substantially perpendicular to the first direction, so that the device isolation pattern being exposed through a recess having a width corresponding to the gap distance, a second dielectric pattern shaped into a line covering an upper surface of the first gate pattern and side surfaces and bottom of the recess along a surface profile of the recess and the first gate pattern in the second direction and a second gate pattern arranged on the second dialectic pattern and including a first conductive pattern and a second conductive pattern, the first conductive pattern arranged on the second dielectric pattern along the surface profile of the recess and the first gate pattern and the second conductive pattern arranged on the first conductive pattern to fill up the recess.

In an example embodiment, the first conductive pattern includes undoped polysilicon and the second conductive pattern includes doped polysilicon having impurities. The impurities of the doped polysilicon includes any one material selected from the group consisting of carbon (C), nitrogen (N), oxygen (O), phosphorus (P), boron (B) and compounds thereof. An aspect ratio of the recess is in a range of about 1 to about 3 on condition that the width of the recess is in a range of about 20 nm and 25 nm. The second dielectric pattern includes a multilayer in which a first oxide layer, a nitride layer and a second oxide layer are sequentially stacked on the first gate pattern.

According to other example embodiments, there is provided a method of manufacturing a non-volatile memory device. A semiconductor substrate that is divided into a field region and an active region may be prepared. A device isolation pattern is arranged in the field region and the active region may be defined by the device isolation pattern. A first dielectric pattern may be formed on the active region of the substrate in a first direction. A first gate pattern may be formed on the first dielectric pattern such that the first gate pattern has a gap distance in a second direction that is substantially perpendicular to the first direction, so that the device isolation pattern is exposed through a recess having a width corresponding to the gap distance. A second dielectric pattern may be formed into a line shape covering an upper surface of the first gate pattern and side surfaces and bottom of the recess along a surface profile of the recess and the first gate pattern in the second direction. A second gate pattern may be formed on the second dielectric pattern to include a first conductive pattern and a second conductive pattern. The first conductive pattern may be arranged on the second dielectric pattern along the surface profile of the recess and the first gate pattern and the second conductive pattern may be arranged on the first conductive pattern to fill up the recess.

In an example embodiment, the second gate pattern may be formed as follows. A first preliminary conductive layer undoped with impurities may be formed on the second dielectric pattern along a surface profile of the recess and the first gate pattern, and a second preliminary conductive layer doped with impurities may be formed on the first preliminary conductive layer to a sufficient thickness to fill the recess. A first heating process may be applied to the second preliminary conductive layer, thereby forming a second conductive layer doped with impurities from the second preliminary conductive layer. A second heating process may be performed to the first preliminary conductive layer, thereby forming a first conductive layer undoped with impurities from the first preliminary conductive layer.

A first cleaning process may be performed to a surface of the second dielectric pattern and a first amorphous silicon layer may be formed on the second dielectric layer by a first deposition process using one of di-silane (Si2H6) gases and tri-silane (Si3H8) gases as a source gas. Thus, the first preliminary conductive layer may be formed on the second dielectric pattern. In such a case, the second preliminary conductive layer may be exemplarily formed as follows. A second amorphous silicon layer may be formed on the first amorphous silicon layer by a second deposition process using monosilane (SiH4) gases as a source gas and impurities may be doped into the second amorphous silicon layer.

In an example embodiment, the impurities may be doped into the second amorphous silicon layer by one of an ion implantation process and a diffusion process, and the impurities may include any one material selected from the group consisting of carbon (C), nitrogen (N), oxygen (O), phosphorus (P), boron (B) and compounds thereof.

In an example embodiment, the first and the second preliminary conductive layers may be formed in different process chambers. A second cleaning process may be further performed on a surface of the first preliminary conductive layer, so that a native oxide layer is removed from the first preliminary conductive layer prior to the step of forming the second preliminary conductive layer. The second cleaning process may include a wet cleaning process using ozone (O3) water, ammonium hydroxide and an aqueous HF solution as a cleaning solution.

In an example embodiment, the first heating process may be performed at a temperature of about 500° C. to about 700° C. and the second heating process may be performed at a temperature of about 750° C. to about 850° C. The first and the second heating processes may be consecutively performed in an inactive gas atmosphere.

In an example embodiment, the first conductive layer and the first conductive layer may be sequentially patterned in the second direction. A third conductive layer may be formed on the second conductive layer. The third conductive layer may include a conductive material selected from the group consisting of tungsten (W), tantalum (Ta) and titanium (Ti) and compounds thereof.

In an example embodiment, the first gate pattern may protrude from a surface of the device isolation pattern to a height of about 60 nm to about 75 nm and the width of the recess may be in a range of about 20 nm to about 25 nm.

In an example embodiment, the first conductive pattern may be formed to a thickness of about 10 nm from a surface of the second dielectric pattern According to some example embodiments of the present inventive concept, the control gate of a non-volatile memory device may include a first layer having good conformal property and formed by a first deposition process and a second layer having good gap-fill characteristics and formed by a second deposition process. The first and the second layers may have different compositions and thus may be selectively crystallized by first and second heating processes at respective temperatures. Therefore, silicon (Si) migration may be sufficiently reduced in forming the control gate, and thus the void and seam defects may be reduced in the control gate of the non-volatile memory device.

While the present example embodiment discloses two consecutive deposition processes and two consecutive heating processes for selective crystallization of the control gate pattern, the non-volatile memory device may also be manufactured through three or more consecutive deposition processes and heating processes in case that the control gate pattern comprises three or more kinds of conductive materials.

BRIEF DESCRIPTION OF THE DRAWINGS

Example embodiments will be more clearly understood from the following detailed description taken in conjunction with the accompanying drawings.

DETAILED DESCRIPTION OF THE EMBODIMENTS

Figure 1:
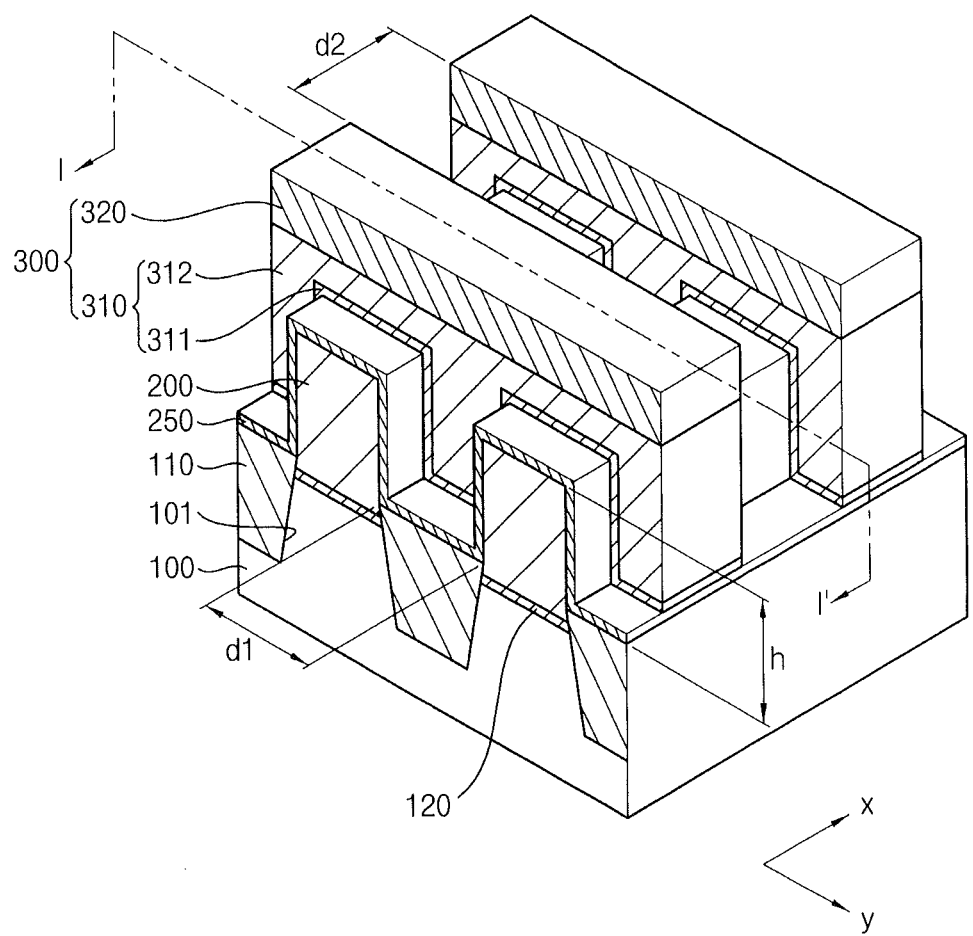
FIG. 1 is a perspective cross-sectional view illustrating a non-volatile memory device in accordance with an example embodiment of the present inventive concept.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Non-Volatile Memory Device

Figure 2:
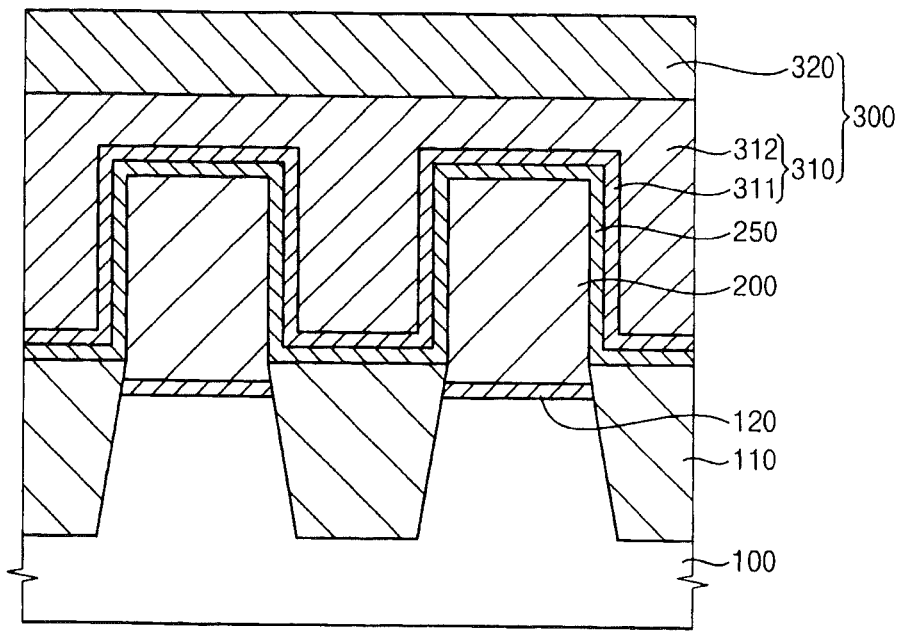
FIG. 2 is a cross-sectional view taken along a line I-I' of the non-volatile memory device in FIG. 1.

FIG. 1 is a perspective cross-sectional view illustrating a non-volatile memory device 500 in accordance with an example embodiment of the present inventive concept. FIG. 2 is a cross-sectional view taken along a line I-I' of the non-volatile memory device 500 of FIG. 1. In the example embodiment illustrated in FIGS. 1 and 2, the non-volatile memory device 500 is a NAND flash memory device. However, it will be appreciated that the NAND flash memory device 500 is illustrative of example embodiments and is not to be construed as limiting thereof. For example, the present inventive concept may also be applied to a NOR flash memory device and other non-volatile memory devices known to those skilled in the art without materially departing from the novel teachings and advantages of the present invention.

Referring to FIGS. 1 and 2, the non-volatile memory device 500 may include a semiconductor substrate 100. The substrate 100 may be divided into a plurality of active regions on which conductive structures are positioned and a field region that defines the active regions. Neighboring active regions may be separated from each other by the field region. In some embodiments, the semiconductor substrate 100 may comprise a single crystalline silicon substrate.

A plurality of generally parallel trenches 101 may be formed in the field region. These trenches 101 may extend in a first direction (labeled the x-direction in FIG. 1) and are spaced apart from each other in a second direction (labeled the y-direction in FIG. 1) that is perpendicular to the x-direction. An inner oxide layer (not shown) may be formed on inner surfaces of the trench 101 using a thermal oxidation process.

The trench 101 may be filled with an insulation layer. An upper surface of the insulation layer may be higher than an upper surface of the substrate 100. Thus, unit cells of the memory device that include the conductive structures on the neighboring active regions may be electrically isolated from each other by the insulation layer. Herein, the insulation layer that fills the trenches 101 is referred to as a device isolation pattern 110. The device isolation pattern 110 may include a plurality of parallel insulation lines that extend in the x-direction that are spaced apart from each other in they-direction. In some embodiments, the device isolation pattern 110 may comprise silicon oxide that is deposited by a CVD process.

A tunnel oxide pattern 120 may be positioned on the active region of the substrate 100 as a first dielectric pattern. The tunnel oxide pattern 120 may be defined by the device isolation pattern 110. An upper surface of the tunnel oxide pattern 120 may be lower than an upper surface of the device isolation pattern 110. In some embodiments, the tunnel oxide pattern 120 may comprise silicon oxide, fluoride-doped or carbide-doped silicon oxide and/or other dielectric materials having a low dielectric constant (low-k material). In the present example embodiment, the tunnel oxide pattern 120 may comprise a silicon oxide layer that is formed by a thermal oxidation process.

A floating gate pattern 200 may be arranged on the tunnel oxide pattern 120. The width of the floating gate pattern 200 may be sized so that the floating gate pattern 200 covers the tunnel oxide pattern 120. Side surfaces of the floating gate pattern 200 may make partial contact with the device isolation pattern 110. The floating gate pattern 200 may have a line shape and may extend along the active region in the x-direction. The floating gate lines of the floating gate pattern 200 may be alternately arranged with a plurality of device isolation lines of the device isolation pattern 110 along the y-direction. The neighboring floating gate lines may be spaced apart by a first gap distance d1 that corresponds to an upper width of the device isolation pattern 110.

The floating gate pattern 200 may protrude from the upper surface of the device isolation pattern 110 to a protrusion height h so that the upper surface of the floating gate pattern is higher above the substrate 100 than is the upper surface of the device isolation pattern 110. Thus, recesses may be formed between neighboring floating gate lines that may be defined by the first gap distance d1 and the protrusion height h.

In some example embodiments, the floating gate pattern 200 may comprise a doped polysilicon floating gate pattern 200 and the first gap distance d1 may be in a range of about 20 nm to about 25 nm. A ratio of the protrusion height h to the first gap distance d1 may be referred to as an aspect ratio of the recess. In the present example embodiment, the protrusion height h may be determined in such a way that the aspect ratio of the recess may be varied in a range of about 1 to about 3. Thus, the protrusion height h may be in a range of about 60 nm to about 75 nm.

An inter-gate dielectric pattern 250 that comprises a second dielectric pattern may be arranged on the upper and side surfaces of the floating gate pattern 200 and on the device isolation pattern 110 along a surface profile of the floating gate pattern 200. The inter-gate dielectric pattern 250 may include an oxide layer having a relatively high dielectric constant (high-k layer) as compared with the tunnel oxide layer 120 and/or a stacked oxide/nitride/oxide multilayer structure. Examples of oxides that may be used to form a high-k dielectric layer include aluminum oxide, hafnium oxide, hafnium aluminum oxide, zirconium oxide, etc. These oxides may be used alone or in combinations thereof. In the present example, the inter-gate dielectric pattern 250 may be a multilayer pattern in which a first oxide layer, a nitride layer and a second oxide layer are sequentially stacked (this multilayer structure is depicted as a single layer in FIGS. 1 and 2).

A control gate pattern 300 may be arranged on the inter-gate pattern 250. The control gate pattern 300 may have a thickness sufficient to fill the recess between the floating gate lines, and may include a plurality of control gate lines that extend in parallel along the y-direction. The control gate lines may be spaced apart from each other by a second gap distance d2 along the x-direction. Thus, the control gate line may be substantially perpendicular to the insulation lines of the device isolation pattern 110.

In some example embodiments, the control gate pattern 300 may include a first control pattern 310 that is in the recess and a second control pattern 320 that is on the first control pattern 310. The first control pattern 310 may include a first polysilicon pattern 311 and a second polysilicon pattern 312. The first polysilicon pattern 311 may have good fluidity and conformal property with respect to the surface profile and thus the void and seams may be reduced or sufficiently prevented along the side surface of the inter-gate dielectric pattern 250 in the recess, and the second polysilicon pattern 312 may have good gap-fill characteristics and thus the recess may be sufficiently filled with the second polysilicon pattern 312.

The first polysilicon pattern 311 may function as a seed layer for the first control pattern 310. Particularly, the first polysilicon pattern 311 may have excellent saturation nucleus density and uniformity and may be coated on the inter-gate dielectric pattern 250 along a surface profile thereof. For example, the first polysilicon pattern 311 may include undoped polysilicon deposited by a chemical vapor deposition (CVD) process using di-silane (Si2H6) gases or trisilane (Si3H8) gases as a source gas. In the present example the first polysilicon pattern 311 may have a thickness of about 10 nm or less.

The second polysilicon pattern 312 may have a crystallization temperature that is lower than the crystallization temperature of the first polysilicon pattern 311, and thus may be crystallized prior to the first polysilicon pattern 311 during a heat treatment that is used to form the first control pattern 310. Therefore, when a high temperature heat treatment is performed to crystallize the first polysilicon pattern 311, most of the second polysilicon pattern may already be crystallized, and thus the silicon migration from the second polysilicon pattern 312 toward the inter-gate dielectric pattern 250 may be reduced or prevented. Accordingly, the number of void and seam defects may be reduced around the side surface of the inter-gate dielectric pattern 250. In some embodiments, the second polysilicon pattern 312 may include polysilicon doped with impurities such as carbon (C), nitrogen (N), oxygen (O), phosphorus (P) and boron (B) by a CVD process.

In the present example embodiment, the first polysilicon pattern 311 may be crystallized at a temperature of about 750° C. to about 850° C., and the second polysilicon pattern 312 may be crystallized at a temperature of about 500° C. to about 700° C.

Since the first polysilicon pattern 311 may have good uniformity and many nucleation sites, the inter-gate dielectric pattern 250 and the first polysilicon pattern 311 may be sufficiently conformal with each other along a surface profile of the inter-gate dielectric pattern 250, thereby reducing the void and seam defects on a boundary surface between the first polysilicon pattern 311 and the inter-gate dielectric pattern 250. In addition, the silicon migration to the inter-gate dielectric pattern 250 may be reduced or prevented in the heat treatment for forming the first control pattern 310, thereby reducing the void and seam defects on the side surfaces of the inter-gate dielectric pattern 250. Therefore, the void and seam defects in the control gate pattern 300 may be reduced or prevented despite of high aspect ratio of the recesses between the floating gate lines of the floating gate pattern 200.

The second polysilicon pattern 312 may have a flat upper surface, and a second control pattern 320 may be positioned on the upper surface of the second polysilicon pattern 312. The second control pattern 320 may include a metal or a metal nitride that has a high work function, and thus may reduce and/or prevent the back tunneling of charges to the floating gate pattern 200 in erasing data in the flash memory device 500.

In some example embodiments, the second control pattern 320 may include a low-resistivity metal, a metal nitride or a metal silicide. Examples of the low-resistivity metal include tantalum (Ta), titanium (Ti), tungsten (W), etc. These may be used alone or in combinations thereof. The metal nitride may include a nitride of the low-resistivity metal, and the metal silicide may include a compound of polysilicon and the low-resistivity metal or the metal nitride.

Impurities may be implanted at surface portions of the substrate 100 using the floating gate pattern 200, the inter-gate dielectric layer 250 and the control gate pattern 300 as an implantation mask and thus source/drain regions may be formed around the stacked gate structures, thereby forming the non-volatile memory device 500.

According to example embodiments of the non-volatile memory device, the void and seam defects may be sufficiently reduced in the control gate pattern even though the aspect ratio of the recesses may be increased between the floating gate lines due to the high integration degree of the semiconductor device, thereby improving the operational reliability of the non-volatile memory device.

Method of Manufacturing a Non-Volatile Memory Device

FIGS. 3 to 8 are cross-sectional views illustrating processing steps for manufacturing the non-volatile memory device shown in FIGS. 1 and 2.

Figure 3:
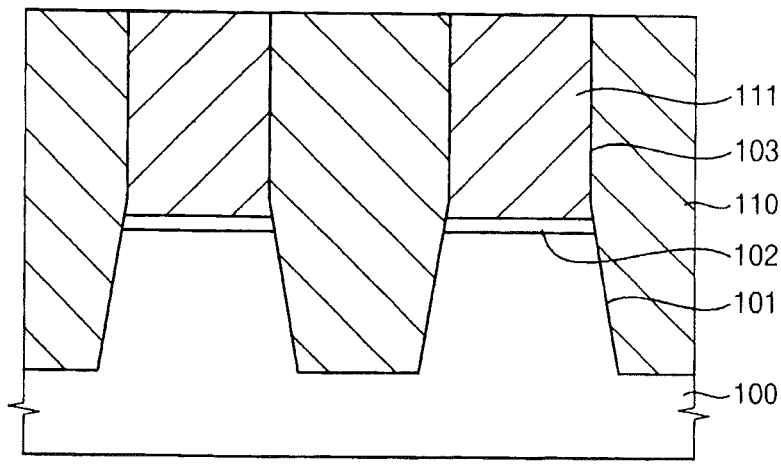
FIGS. 3 to 8 are cross-sectional views illustrating processing steps for a method of manufacturing the non-volatile memory device shown in FIGS. 1 and 2.

Referring to FIG. 3, a semiconductor substrate 100, such as a silicon wafer, may be prepared, and the device isolation pattern 110 may be formed to protrude from an upper surface of the substrate 100. The substrate 100 may be divided into a field region and a plurality of active regions that are defined by the field region, and the device isolation pattern may be formed in the field region.

In some example embodiments, the structure illustrated in FIG. 3 may be formed as follows: First, a pad oxide layer (not illustrated) may be formed on the substrate 100, and a sacrificial layer (not illustrated) may be formed on the pad oxide layer. The sacrificial layer may be partially removed from the pad oxide layer and at least one opening (not illustrated) is formed through the sacrificial layer, thereby forming a sacrificial pattern having the opening through which the pad oxide layer may be exposed along the active region of the substrate. A mask layer (not illustrated) may be formed on the sacrificial pattern to a sufficient thickness to fill up the opening in the sacrificial layer, and an upper portion of the mask layer may be planarized until an upper surface of the sacrificial pattern is exposed. Thus, the mask layer may be formed into a mask pattern 111 that covers the active regions of the substrate 100. Then, the sacrificial pattern may be removed from the substrate 100, and the pad oxide layer on the field region of the substrate 100 may be exposed through the mask pattern 111.

The pad oxide layer and a portion of the substrate 100 may be etched away in the field region by an etching process using the mask pattern 111 as an etching mask, thereby forming a trench 101 that extends in the x-direction on the substrate 100. Both the trench 101 and the mask pattern 111 may be formed by an isotropic etching process, and thus a side surface of the mask pattern 111 may be substantially perpendicular to the pad oxide layer. The trench 101 may be formed so that an upper portion may be larger than a lower portion thereof. The pad oxide layer may remain merely on the active region of the substrate 100, thereby forming a pad oxide pattern 102 on the substrate 100.

The trench 101 may be filled with insulation materials to form the device isolation pattern 110 in the trench 101. For example, a device isolation layer (not illustrated) that includes silicon oxide may be formed on the mask pattern to a sufficient thickness to fill up the trench 101 and a recess 103 of the mask pattern that may communicate with the trench 101. This device isolation layer may be planarized until an upper surface of the mask pattern 111 is exposed. Therefore, the planarization process may convert the device isolation layer into the device isolation pattern 110. The device isolation pattern 110 may fill the recess 103 and the trench 101.

Figure 4:
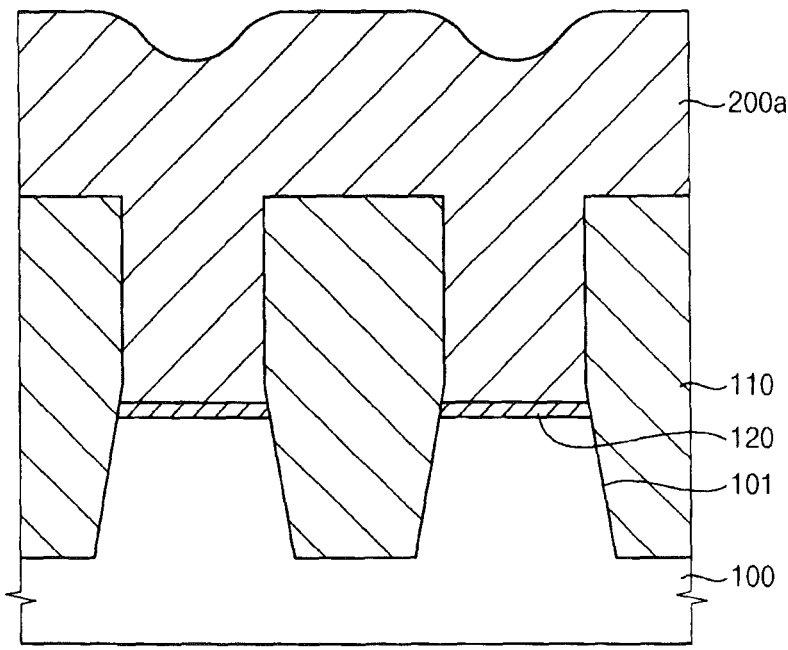

Referring to FIG. 4, a floating gate layer 200a may be formed on a substrate 100 including the device isolation pattern 110.

In some example embodiments, the floating gate layer 200a may be formed as follows. First, the mask pattern 111 and the pad oxide pattern 102 may be sequentially removed from the active region, thereby forming an active opening through which the active regions of the substrate 100 may be exposed. The active opening may be defined by the device isolation pattern 110. The mask pattern 111 may be removed from the pad oxide pattern 102 by a wet etching process using an etchant including phosphorus (P), and the pad oxide pattern 102 may be removed from the substrate 100 by a wet etching process using an etchant including an aqueous hydrogen fluoride (HF) solution.

Then, a first dielectric pattern 120 may be formed on the active region that is exposed through the active opening. The first dielectric pattern 120 may comprise, for example, a silicon oxide layer that is formed by a thermal oxidation process, a silicon oxide layer that is doped with impurities such as carbon (C) and/or fluorine (F) and/or another material layer having a low dielectric constant. In the present example embodiment, the first dielectric pattern 120 may function as a tunnel oxide pattern of a flash memory device.

A floating gate layer 200a may be formed on the first dielectric layer 120 and the device isolation pattern 110 to a sufficient thickness to fill up the active opening. The floating gate layer 200a may comprise, for example, a doped polysilicon layer.

The polysilicon may be deposited onto the first dielectric pattern 120 and the device isolation pattern 110 by a low pressure chemical vapor deposition (LPCVD) process in-situ with a doping process of impurities, to thereby form the floating gate layer 200a. In other embodiments, the polysilicon may be deposited onto the first dielectric pattern 120 and the device isolation pattern 110, and then the doping process may be subsequently performed on the polysilicon layer. The doping process may be, for example, an ion implantation process or a diffusion process.

Figure 5:
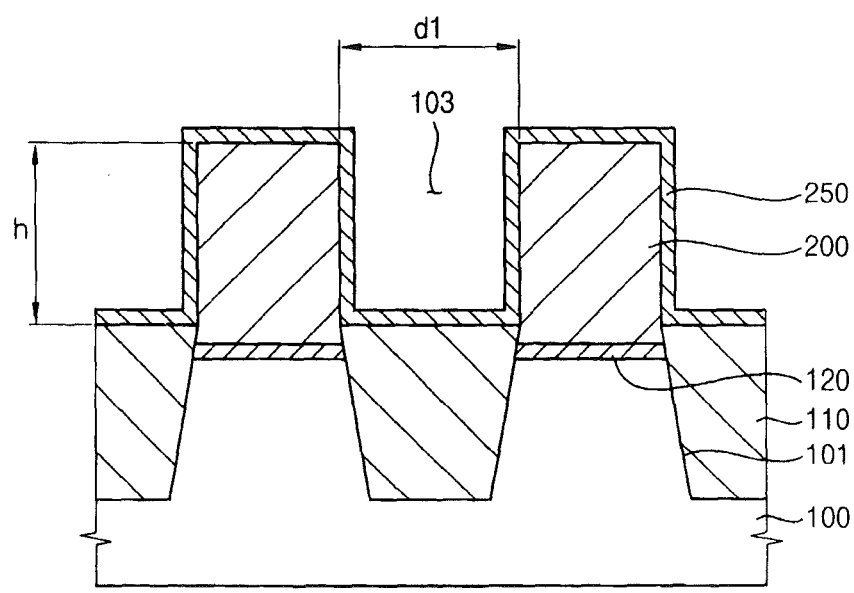

Referring to FIG. 5, the floating gate pattern 200 may be formed on the active region of the substrate 100, and a second dielectric layer 250 may be formed on the floating gate pattern 200 and the device isolation pattern 110.

According to example embodiments, the structure of FIG. 5 may be formed as follows. First, an upper portion of the floating gate layer 200a may be removed by a planarization process such as a chemical mechanical polishing (CMP) process until a top surface of the device isolation pattern 110 is exposed. The floating gate layer 200a may remain merely in the active region. Thus, the floating gate layer 200a may be formed into the floating gate pattern 200 that may be positioned on the first dielectric pattern 120 to fill the active region.

The floating gate pattern 200 may include a plurality of floating gate lines that extend in the x-direction parallel to the device isolation pattern 110 and arranged alternately with device isolation pattern 110 in the y-direction. In the present example embodiment, the floating gate lines may be spaced apart from each other by a first gap distance d1.

Then, the device isolation pattern 110 may be partially removed from the substrate 100 by an isotropic or anisotropic etching process in such a manner that an upper surface of the device isolation pattern 110 may be lower than an upper surface of the floating gate pattern 200. The upper surface of the device isolation pattern 110 may, however, be higher than an upper surface of the first dielectric pattern 120 in order to reduce or prevent the first dielectric pattern 120 from being damaged during the etching process that is used to remove the device isolation pattern 110.

Due to the partial removal of the device isolation pattern 110, the device isolation pattern 110 may be exposed through the recess 103 between adjacent floating gate lines. In addition, each of the floating gate lines may protrude from the upper surface of the device isolation pattern 110 to the protrusion height h.

Thereafter, the second dielectric layer 250 may be formed on the floating gate pattern 200 and the device isolation pattern 110 along a surface profile of the floating gate pattern 200. Thus, the second dielectric layer 250 may be formed on the upper surface and side surfaces of the floating gate pattern 200 and on the device isolation pattern 110.

In some example embodiments, the second dielectric layer 250 may comprise a multilayer structure such as an oxide/nitride/oxide (ONO) layer, or a single material layer that has a high dielectric constant. For example, the ONO layer may be formed through an LPCVD process, and the single material layer may be formed through an atomic layer deposition (ALD) process or a plasma-enhanced CVD (PECVD) process. The second dielectric layer 250 may be patterned into a line extending in the y-direction. However, the second dielectric layer 250 may also be patterned together with a control gate layer that may be described hereinafter.

In the present example embodiment, the first gap distance d1 may be in a range of about 20 nm to about 25 nm and the protrusion height h may be in a range of about 60 nm to about 75 nm. Thus, the aspect ratio of the recess 103 may be in a range of about 1 to 3. The first gap distance d1 may correspond to a width of the recess 103 and thus may be determined by a first stop point at which the etching process for forming the mask pattern 111 may be stopped. In addition, the protrusion height h may be determined by a second stop point at which the etching process for partially forming the device isolation pattern 110.

When the recess 103 has a sufficient width and the neighboring floating gate lines are sufficiently spaced apart, the control gate pattern 300 may be formed in the recess 103 with few or no void and seam defects. However, when the recess 103 has a small width and/or the aspect ratio of the recess 103 is excessively high, the control gate pattern 300 may be formed on the second dielectric layer 250 by the following 2-step deposition process and 2-step heat treatment, to thereby reduce and/or prevent the formation of void and/or seam defects.

Figure 6:
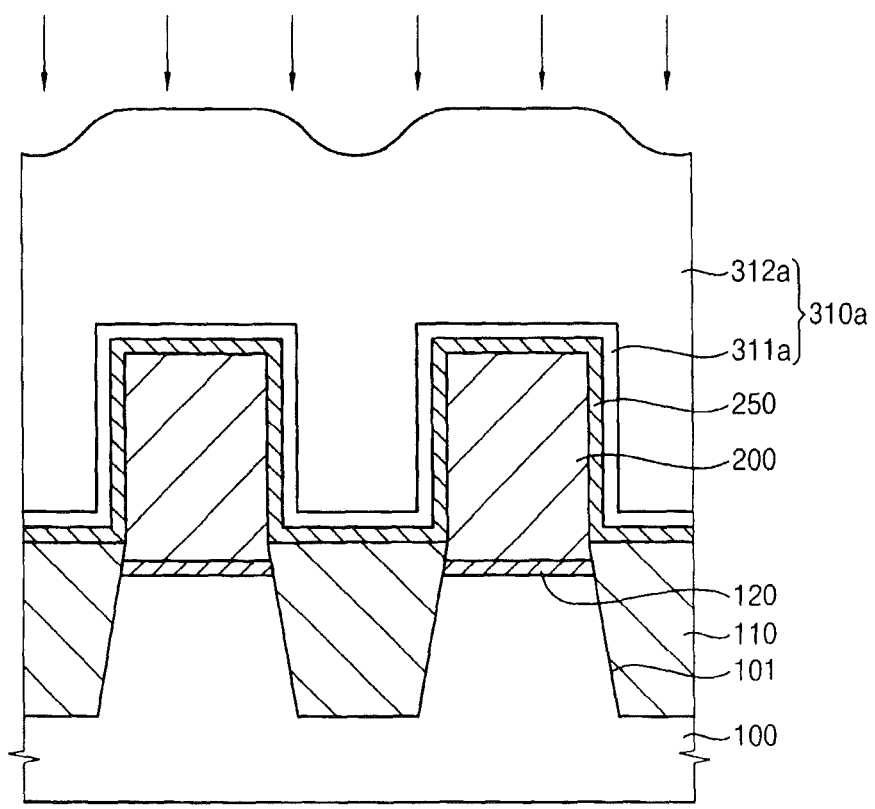

Referring to FIG. 6, a first preliminary control layer 310a may be formed on the second dielectric layer 250 to a sufficient thickness to fill the recess 103. The first preliminary control layer 310a may include first and second preliminary silicon layers 311a and 312a.

The first preliminary silicon layer 311a may be formed uniformly on the second dielectric layer 250 to a thickness of about 10 nm or less along a surface profile of the second dielectric layer 250.

In some example embodiments, the first preliminary silicon layer 311a may be formed by a first deposition process such as an LPCVD process or a PECVD process using a first source gas. The first source gas may have a good conformal property so that the first preliminary silicon may be coated onto the second dielectric layer 200 with excellent uniformity despite the high aspect ratio of the recess 103. Thus, the first deposition process for forming the first preliminary silicon layer 311a may be conducted using precise deposition control rather than high deposition speed, and thus the first preliminary silicon layer may be formed on the second dielectric layer 250 at relatively high deposition density. As a result, the void and seam defects may be sufficiently reduced or prevented on the surface of the second dielectric layer 250.

The first source gas may include disilane (Si2H6) gases, trisilane (Si3H8) gases and a mixture thereof, and the first deposition process using the first source gas may be conducted at a relatively low speed. Thus, the first preliminary silicon layer 311a may be formed to a thickness of about 8 nm to about 12 nm, more particularly, to about 10 nm from the surface of the second dielectric layer 250. In the present example embodiment, the first preliminary silicon layer 311a may comprise an amorphous silicon layer.

A first cleaning process may be performed prior to the deposition of the first preliminary silicon layer 311a. Thus, various impurities may be removed from the surface of the second dielectric layer 250 by the first cleaning process, to thereby improve adherence between the second dielectric layer 250 and the first preliminary silicon layer 311a. The first cleaning process may include a wet cleaning process using ozone (O3) water, ammonium hydroxide and/or an aqueous HF solution or a dry cleaning process using a plasma nitridation process and/or a plasma oxidation process.

The second preliminary silicon layer 312a may be formed by a second deposition process such as an LPCVD process or a PECVD process using a second source gas. The second source gas may have a good gap-fill property so that the recess 103 on which the first preliminary silicon is coated may be sufficiently filled with the second preliminary silicon layer 312a. Thus, the second deposition process for forming the second preliminary silicon layer 312a may be conducted using a high deposition speed rather than precise deposition control so that the gap-fill property may not deteriorate, to thereby increase the process efficiency of the first preliminary control layer 310a. The second preliminary silicon layer 312a may be formed on the first preliminary silicon layer 311a to a sufficient thickness to fill the recess 103.

The second source gas may include silane (SiH4) gases and the second deposition process using the second source gas may be conducted at a relatively high speed. Thus, the recess 103 between the floating gate lines may be sufficiently filled up with the control layer 310a.

The first deposition process and the second deposition process may be consecutively performed in the same chamber or may be individually performed in respective chambers. If the first and the second deposition processes are consecutively performed in the same chamber, a purge process may be performed after the first deposition process in order to purge residuals and byproducts of the first deposition process from the chamber. Thereafter, the second source gases may be supplied into the same chamber and the second deposition process may be initiated in the same chamber.

In contrast, if the first and the second deposition processes are performed in different chambers, a native oxide layer may be formed on the first preliminary silicon layer 311a during the inter-chamber transfer. An electrical resistance may be increased at a boundary surface of the first and the second preliminary silicon layers 311a and 312a due to the native oxide layer, which may increase the electrical resistance of the control gate pattern 300. Consequently, a second cleaning process may be performed on a surface of the first preliminary silicon layer 311a prior to the second deposition process, thereby removing any native oxide layer from the first preliminary silicon layer 311a. A wet cleaning process, rather than a dry cleaning process, may be used as the second cleaning process and thus no damage may be caused to the second dielectric layer 250 in performing the second cleaning process. The second cleaning process may include a wet cleaning process using ozone (O3) water, ammonium hydroxide and/or an aqueous HF solution.

Thereafter, impurities may be supplied into the second preliminary silicon layer 312a and thus the second preliminary silicon layer 312a may have a composition that differs from the composition of the first preliminary silicon layer 311a. As a result, the first and the second preliminary silicon layers 311a and 312a may be crystallized at different temperatures. For example, elements in Group III and/or Group V of the Periodic Table such as carbon (C), oxygen (O), nitrogen (N), phosphorus (P) and boron (B) may be supplied into the second preliminary silicon layer 312a, to thereby change the charge density and polarity of the second preliminary silicon layer 312a. The impurities may be supplied into the second preliminary silicon layer 312a by an ion implantation process or a diffusion process. The impurities may be supplied into the second preliminary silicon layer 312a in a manner that largely prevents the impurities from being supplied into the first preliminary silicon layer 311a.

Figure 7:
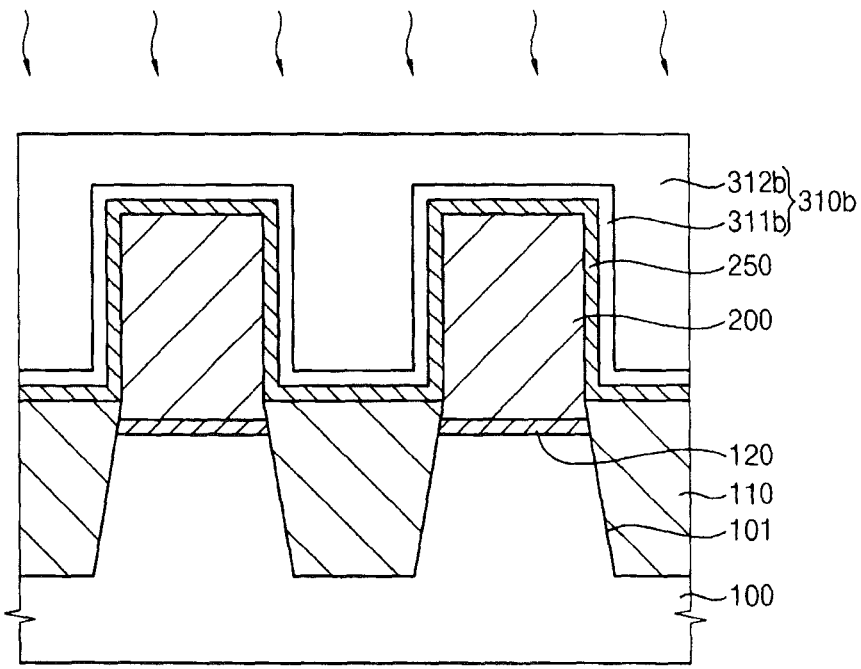

Referring to FIG. 7, a heat treatment may be performed on the first preliminary control layer 310a, thereby forming a first control layer 310b including a first polysilicon layer 311b and a second polysilicon layer 312b.

The heat treatment may include a first heating process and a second heating process that may be performed at different temperatures, respectively, and thus the first and the second preliminary silicon layers 311a and 312a may be selectively crystallized at the respective first and second temperatures. That is, the first and the second preliminary silicon layers 311a and 312a may have different compositions and thus may be crystallized individually at different temperatures. Therefore, the first control layer 310b may be formed with little or no silicon migration, thereby reducing the void and seam defects in the first control layer 310b.

For example, the first heating process may be performed at a temperature of about 500° C. to about 700° C. and the second heating process may be performed at a temperature of about 750° C. to about 800° C. The first and the second heating processes may be performed consecutively. The second preliminary silicon layer 312a may be converted into a second polysilicon layer 312b by the first heating process, and the first preliminary silicon layer 311a may be converted into a first polysilicon layer 311b by the second heating process. Accordingly, the first preliminary control layer 310a including amorphous silicon may be converted into a first control layer 310b by a heat treatment that includes first and second heating processes that are consecutively performed at a low temperature and a high temperature, respectively.

Since the second preliminary silicon layer 312a may be crystallized at a relatively low temperature by the first heating process, the first preliminary silicon layer 311a may be crystallized at a relatively high temperature by the second heating process with little or no silicon migration from the second preliminary silicon layer 312a. For that reason, void and seam defects that may result from silicon migration may be reduced or eliminated in the first control layer 310b.

In the present example embodiment, the heat treatment may be performed in an inactive gas atmosphere, thereby minimizing chemical reaction of the first and the second preliminary silicon layers 311a and 312a. Examples of the inactive gases may include mono-atomic molecules such as nitrogen (N2) molecules and inert gases such as helium (He) and argon (Ar).

Thereafter, an upper portion of the second silicon layer 312b may be planarized by a CMP process so that the first control layer 310b has a flat upper surface.

Figure 8:
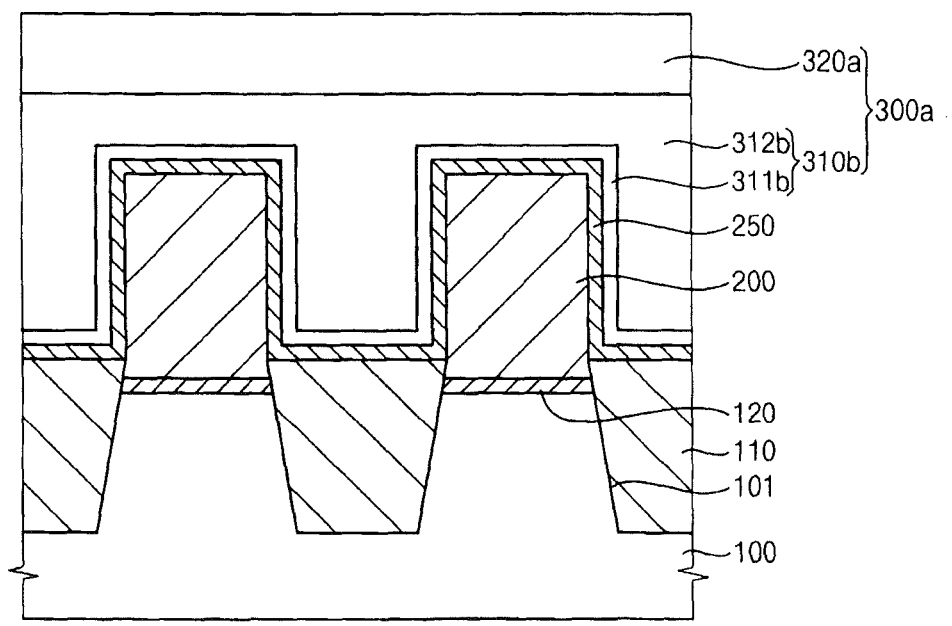

Referring to FIG. 8, the second control layer 320a may be formed on the first control layer 310b. The second control layer 320a may include a metal having high work function or a nitride layer of the metal having the high work function. Thus, the second control layer 320a may improve conductivity of the control gate layer 300a that includes the first and the second control layers 310b and 320a.

In some example embodiments, the second control layer 320a may be formed by depositing a conductive metal onto the second silicon layer 312b so as to form a metal silicide layer on the second silicon layer 312b as the second control layer 320a. Examples of the conductive metal may include tungsten (W), tantalum (Ta) and titanium (Ti), etc. These may be used alone or in combinations thereof. A boundary layer may be further formed at a boundary region between the second silicon layer 312b and a metal layer thereon, thereby improving adhesion of the metal to the second silicon layer 312b and the ohmic characteristics of the metal layer. The boundary layer may include a nitride layer of the metal that may be deposited onto the second silicon layer 312b. In other embodiments, a polysilicon layer may be formed on the second silicon layer 312b as the second control layer 320a and thus the control gate layer 300a may comprise polysilicon.

Thereafter, a hard mask pattern (not illustrated) may be formed on the second control layer 320a. The second control layer 320a, the first control layer 310b and the inter-gate dielectric layer may be sequentially patterned into a line shape that extends in the y-direction by an etching process using the hard mask pattern as an etching mask, thereby forming the control gate pattern 300 and the inter-gate dielectric pattern 250. Therefore, the first dielectric pattern 120, the floating gate pattern 200, the second dielectric pattern 250 and the control gate pattern 300 may be stacked on a cell region of the substrate 100, thereby forming the stacked gate structure on the substrate 100. Impurities may be implanted onto the substrate 100 and source/drain regions (not illustrated) may be formed on the substrate 100 to complete the non-volatile memory device 500.

According to a method of manufacturing the non-volatile memory device, the control gate of a non-volatile memory device may include a first layer having good conformal properties that is formed by a first deposition process and a second layer having good gap-fill characteristics that is formed by a second deposition process. The first and the second layers may have different compositions and thus may be selectively crystallized by first and second heating processes at respective temperatures. Therefore, silicon (Si) migration may be sufficiently reduced and/or prevented in forming the control gate, and thus the void and seam defects may be reduced in the control gate of the non-volatile memory device.

Memory System

Figure 9:
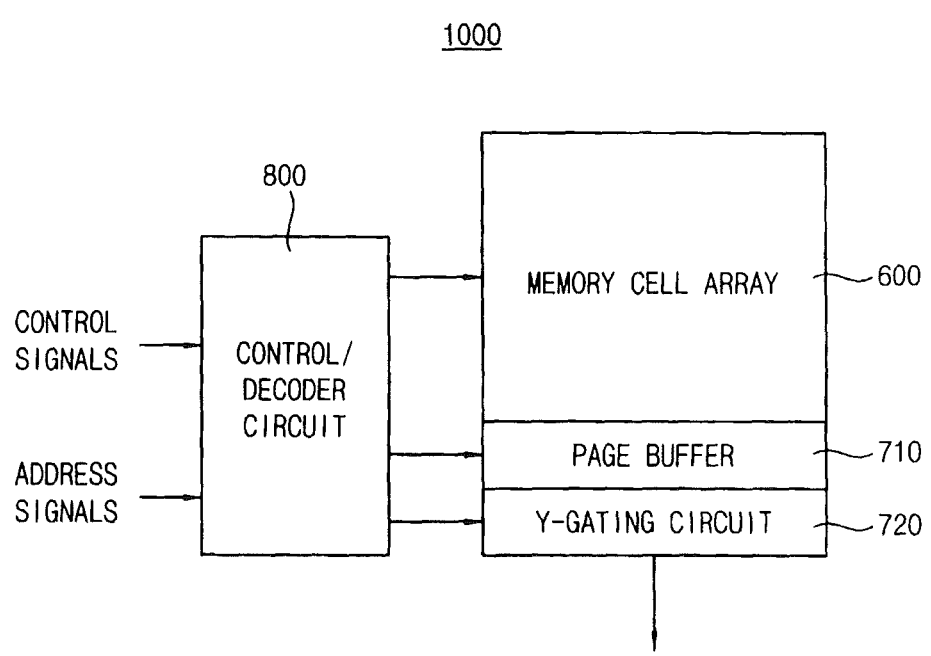
FIG. 9 is a block diagram illustrating a memory system having the non-volatile memory device illustrated in FIG. 1 in accordance with an example embodiment of the present inventive concept.

FIG. 9 is a block diagram illustrating a memory system having the non-volatile memory device of FIG. 1 in accordance with an example embodiment of the present inventive concept. In the present example embodiment, a NAND flash memory system having the NAND memory device will be illustrated as the memory system. However, the NAND flash memory system is illustrative of example embodiments and is not to be construed as limiting thereof. For example, the present inventive concept may also be applied to a NOR flash memory system having a NOR memory device and other non-volatile memory system known to those skilled in the art without materially departing from the novel teachings and advantages of the present invention.

Referring to FIG. 9, the memory system 1000 according to an example embodiment of the present inventive concept may include a cell array 600 that has a plurality of memory cells for storing data, a page buffer block 710 and a Y-gating circuit 720 for controlling the memory cells in the memory cell array 600 and a control/decoder circuit 800 for electrically operating the memory cell array 600, the page buffer block 710 and the y-gating circuit 720. The memory cells in the memory cell array 600 may have the same structure as described with reference to FIG. 1 and electronic data may be stored to the memory cells.

Various control signals and address signals may be transferred to the control/decoder circuit 800 and the control/decoder circuit 800 may transfer operation signals to the memory cell array 600, the page buffer block 710 and the y-gating circuit 720 according to the control signals and address signals.

For example, the memory cell array 600 may include a plurality of memory blocks and each of the memory blocks may include a plurality of bit lines and a plurality of cell strings electrically connected to one of the bit lines. Each of the cell strings may include a string selection transistor connected to the bit line, a ground selection transistor connected to a common source line and a plurality of memory cells connected in series between the string selection transistor and the ground selection transistor. Each of the memory cells may include the non-volatile memory cell shown in FIG. 1. Each of the bit lines may be connected to a page buffer in the page buffer block 710.

Each of the page buffers in the page buffer block 710 may be operated by the operation signals transferred from the control/decoder circuit 800 and may provide a buffer space for reading/writing data from/to the memory cells in the memory cell array 600. The Y-gating circuit 720 may select one of the page buffers in the page buffer block 710 corresponding to some of the memory cells in accordance with the operation signals of the control/decoder circuit 800.

According to the memory system of the present example embodiment, the void and seam defects in each of the memory cells in the memory cell array 600 may be reduced despite a high aspect ratio at the stacked gate structure, and thus operational reliability may be sufficiently improved in reading and writing data in each of the memory cells. Accordingly, the memory system 1000 may have an improved performance with high operational reliability even when the memory cell array has a high degree of integration.

The above memory system 1000 may be applied to various electronic instruments. For example, various memory cards may be manufactured to have the memory system 1000 based on industrial standards and the memory cards may be applied to various portable electronic instruments such as a digital camera, a notebook computer, an MP3 player for storing audio and video data. In such a case, the memory system 100 may further include a decoder (not illustrated) and an encoder (not illustrated) for converting analogue audio, video and image data into respective digital data. In addition, the memory system 1000 may be directly connected to a central processing unit (CPU) of a computer system or may be indirectly connected to the CPU via a bus line, and thus may function as a supplementary memory or a storage device for the computer system.

According to the example embodiments of the present inventive concept, the control gate of a non-volatile memory device may include a first layer having good conformal properties and formed by a first deposition process and a second layer having good gap-fill characteristics and formed by a second deposition process. The first and the second layers may have different compositions and thus may be selectively crystallized by first and second heating processes at respective temperatures. Therefore, silicon (Si) migration may be sufficiently reduced or prevented in forming the control gate, and thus void and seam defects may be reduced in the control gate of the non-volatile memory device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory device, comprising:
a field region that defines an active region in a semiconductor substrate;
a floating gate pattern on the active region;
a dielectric layer on the floating gate pattern; and
a control gate on the dielectric layer, the control gate including a first conductive pattern that has a first composition that crystallizes in a first temperature range, and a second conductive pattern that has a second composition that is different from the first composition and that crystallizes in a second temperature range that is lower than the first temperature range, the first conductive pattern being between the dielectric layer and the second conductive pattern.

2. The non-volatile memory device of claim 1, wherein the floating gate pattern comprises a first floating gate pattern, the non-volatile memory device further including a second floating gate pattern that is spaced apart from the first floating gate pattern to define a recess therebetween, wherein a distance between the first and second floating gate patterns that defines width of the recess is between about 20 nm and about 25 nm, and wherein an aspect ratio of the recess is between about 1 to about 3.

3. The non-volatile memory device of claim 1, wherein the first conductive pattern comprises an undoped polysilicon pattern, and wherein the second conductive pattern comprises a polysilicon pattern doped with impurities.

4. The non-volatile memory device of claim 3, wherein the impurities comprise carbon (C), nitrogen (N), oxygen (O), phosphorus (P), and/or boron (B), and/or compounds thereof.

5. The non-volatile memory device of claim 1, wherein the control gate further includes a third conductive pattern on the second conductive pattern, the third conductive pattern including at least a metal, a metal nitride and/or a metal silicide.

6. The non-volatile memory device of claim 5, wherein a thickness of the first conductive pattern is about 12 nm or less.

7. The non-volatile memory device of claim 6, wherein the first floating gate pattern protrudes from a surface of the device isolation pattern to a height of about 60 nm to about 75 nm.

8. The non-volatile memory device of claim 1, wherein the second temperature range is between about 500° C. and about 700° C., and wherein the first temperature range is between about 750° C. and about 850° C.

9. The non-volatile memory device of claim 8, wherein the first conductive pattern is formed using disilane (Si2H6) and/or trisilane (Si3H8) as a source gas, and wherein the second conductive pattern is formed using monosilane (SiH4) as a source gas.

10. The non-volatile memory device of claim 1, wherein the first conductive pattern is conformally coated on the dielectric layer, and wherein a density of the first conductive pattern exceeds a density of second conductive pattern.

11. A non-volatile memory device comprising:
a semiconductor substrate that includes a first active region that extends in a first direction, a second active region that extends in the first direction substantially parallel to the first active region, and a field region having a device isolation pattern thereon between the first and second active regions;
a first gate pattern that extends in the first direction on the first active region;
a second gate pattern that extends in the first direction on the second active region, the first and second gate patterns defining a recess therebetween, wherein an upper surface of the device isolation pattern forms a bottom surface of the recess;
a dielectric pattern covering an upper surface of the first gate pattern, an upper surface of the second gate pattern and a first side surface, a second side surface and the bottom surface of the recess along a surface profile of the recess and the first and second gate patterns, the dielectric pattern extending in a second direction that is substantially perpendicular to the first direction;
a control gate pattern on the dielectric pattern, the control gate pattern including a first conductive pattern on the dielectric pattern along the surface profile of the recess and the first and second gate patterns, and a second conductive pattern on the first conductive pattern, the first and second conductive patterns filling the recess.

12. The non-volatile memory device of claim 11, wherein the first conductive pattern includes undoped polysilicon and the second conductive pattern includes polysilicon that is doped with impurities.

13. The non-volatile memory device of claim 12, wherein the impurities of the doped polysilicon includes any one material selected from the group consisting of carbon (C), nitrogen (N), oxygen (O), phosphorus (P), boron (B) and compounds thereof.

14. The non-volatile memory device of claim 11, wherein an aspect ratio of the recess is in a range of about 1 to about 3, and wherein the width of the recess is in a range of about 20 nm to about 25 nm.

15. The non-volatile memory device of claim 11, wherein the dielectric pattern includes a multilayer in which a first oxide layer, a nitride layer and a second oxide layer are sequentially stacked, the non-volatile memory device further comprising a tunnel oxide pattern on the first and second active regions.

16. A non-volatile memory device, comprising:
a semiconductor substrate that includes a first active region that extends in a first direction, a second active region that extends in the first direction substantially parallel to the first active region, and a field region having a device isolation pattern thereon between the first and second active regions;
a first floating gate pattern that extends in the first direction on the first active region;
a second floating gate pattern that extends in the first direction on the second active region, the first and second floating gate patterns defining a recess therebetween, wherein an upper surface of the device isolation pattern forms a bottom surface of the recess;
a dielectric pattern covering an upper surface of the first floating gate pattern, an upper surface of the second floating gate pattern and a first side surface, a second side surface and the bottom surface of the recess along a surface profile of the recess and the first and second floating gate patterns;
a control gate pattern on the dielectric pattern, the control gate pattern including a first conductive pattern that has a first composition that crystallizes in a first temperature range on the dielectric pattern along the surface profile of the recess and the first and second floating gate patterns, and a second conductive pattern that has a second composition that is different from the first composition and that crystallizes in a second temperature range that is lower than the first temperature range on the first conductive pattern.

17. The non-volatile memory device of claim 16, wherein the first conductive pattern comprises an undoped polysilicon pattern having a thickness of less than about 12 nm, and wherein the second conductive pattern comprises a polysilicon pattern doped with impurities.

18. The non-volatile memory device of claim 17, wherein a density of the first conductive pattern exceeds a density of second conductive pattern.

19. The non-volatile memory device of claim 16, wherein a distance between the first and second floating gate patterns that defines width of the recess is between about 20 nm and about 25 nm, and wherein a height of the first floating gate pattern above a top surface of the device isolation pattern that defines a height of the recess is between about 60 nm to about 75 nm.

20. The non-volatile memory device of claim 16, wherein the second temperature range is between 500° C. and 700° C., and wherein the first temperature range is between 750° C. and 850° C.

* * * * *